United States Patent
Yonekawa

(10) Patent No.: US 9,437,734 B2
(45) Date of Patent: Sep. 6, 2016

(54) SEMICONDUCTOR DEVICE WITH PROTECTIVE FILMS AND MANUFACTURING METHOD THEREOF

(75) Inventor: Kiyotaka Yonekawa, Miyazaki (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 13/196,984

(22) Filed: Aug. 3, 2011

(65) Prior Publication Data
US 2012/0037963 A1    Feb. 16, 2012

(30) Foreign Application Priority Data

Aug. 11, 2010  (JP) ................. 2010-180092

(51) Int. Cl.
| H01L 29/78 | (2006.01) |
| H01L 21/02 | (2006.01) |
| H01L 23/29 | (2006.01) |
| H01L 23/31 | (2006.01) |
| H01L 29/40 | (2006.01) |
| H01L 29/66 | (2006.01) |

(52) U.S. Cl.
CPC ..... *H01L 29/7835* (2013.01); *H01L 21/02129* (2013.01); *H01L 21/02216* (2013.01); *H01L 21/02271* (2013.01); *H01L 23/291* (2013.01); *H01L 23/3192* (2013.01); *H01L 29/402* (2013.01); *H01L 29/66659* (2013.01); *H01L 2924/0002* (2013.01)

(58) Field of Classification Search
CPC . H01L 29/66659; H01L 29/66681–29/66704; H01L 29/7816–29/7826; H01L 29/7835

USPC ................................. 257/288, 289
See application file for complete search history.

(56) References Cited

U.S. PATENT DOCUMENTS

| 5,070,386 A | * | 12/1991 | Imura ........................... 257/641 |
| 2004/0155279 A1 | * | 8/2004 | Kutsunai et al. ............. 257/306 |
| 2009/0203176 A1 | * | 8/2009 | Kakehata ...................... 438/164 |

(Continued)

FOREIGN PATENT DOCUMENTS

| EP | 0485086 A1 | 5/1992 |
| JP | 04-266028 | 9/1992 |

(Continued)

OTHER PUBLICATIONS

Machine translation of JP 2006-222210 A.*
Japanese Office Action issued on Feb. 25, 2014 with partial English translation.

*Primary Examiner* — Bryan Junge
(74) *Attorney, Agent, or Firm* — Rabin & Berdo, P.C.

(57) ABSTRACT

A semiconductor device includes a semiconductor substrate having a drain region, a source region and an impurity diffusion region; an oxide film formed on the impurity diffusion region; a first protective film including a SiN film as a principal component and being formed on the oxide film; and a second protective film containing carbon and being formed on the first protective film. A method of manufacturing the semiconductor device, includes doping an impurity into a semiconductor substrate, thereby forming a drain region, a source region and an impurity diffusion region; forming an oxide film on the impurity diffusion region; forming a first protective film including a SiN film as a principal component on the oxide film; and forming a second protective film containing carbon on the first protective film.

9 Claims, 4 Drawing Sheets

(56) References Cited

U.S. PATENT DOCUMENTS

2010/0140715 A1* 6/2010 Nakamura ......... H01L 29/0653
257/368
2010/0301413 A1* 12/2010 You ............................. 257/343

FOREIGN PATENT DOCUMENTS

| JP | 07-263547 A | 10/1995 |
| JP | 2006-222210 A | 8/2006 |
| JP | 2010-016153 A | 1/2010 |

* cited by examiner

SEMICONDUCTOR DEVICE WITH PROTECTIVE FILMS AND MANUFACTURING METHOD THEREOF

BACKGROUND OF THE INVENTION

1. Field of the Invention

The present invention relates to a semiconductor device with a protective film as a silicon nitride (SiN) film, and a method of manufacturing the same, and more particularly, to a semiconductor device to which a high voltage signal is applied as a control signal and a method of manufacturing the same.

2. Description of the Related Art

Various semiconductor devices, in which a final protective film is a SiN film, have been suggested. See Japanese Patent Kokai Publication No. 7-263547 (patent document 1) and Japanese Patent Kokai Publication No. 2010-16153 (patent document 2), for example. In general, as illustrated in FIG. 1, a lateral power metal-oxide-semiconductor field-effect transistor (MOSFET) 1 having a reduced surface field (RESURF) structure includes a P-type semiconductor substrate 11, which has an $N^+$ drain region 13, a drain drift region (N-well region) 12, a $P^+$ impurity region 15, a P-type body region 14 and an $N^+$ source region 16; a field oxide film 17; a gate electrode 18; an interlayer dielectric film, i.e., inter layer dielectrics (ILD) 20; metal layers 21 and 22; and a SiN film 23 as a final protective film. When the semiconductor device is actually used, a high voltage is applied between a pad (not illustrated in the drawing) connected to the metal layer 21 and another pad (not illustrated in the drawing) connected to the metal layer 22.

However, in the conventional semiconductor device, when the semiconductor device is actually used and a high voltage is applied between the pads, a leakage current flows in a surface of the SiN film and negative charges are trapped in the surface of the SiN film. This is caused by that a large number of dangling bonds (incomplete bonds) occur in the surface of the SiN film and that the surface of the SiN film easily absorbes external water. By an influence of the negative charges trapped in the surface of the SiN film, a depletion layer may be formed under the field oxide film (channel). In this case, there is a problem that operational characteristics of the semiconductor device fluctuate.

SUMMARY OF THE INVENTION

An object of the present invention is to provide a semiconductor device capable of reducing fluctuations in device operational characteristics, even if a SiN film is used as a protective film and to provide a method of manufacturing such semiconductor device.

According to an aspect of the present invention, a semiconductor device includes a semiconductor substrate having a drain region, a source region and an impurity diffusion region; an oxide film formed on the impurity diffusion region; a first protective film including a SiN film as a principle principal component and being formed on the oxide film; and a second protective film containing carbon and being formed on the first protective film.

According to another aspect of the present invention, a method of manufacturing the semiconductor device, includes doping an impurity into a semiconductor substrate, thereby forming a drain region, a source region and an impurity diffusion region; forming an oxide film on the impurity diffusion region; forming a first protective film including a SiN film as a principal component on the oxide film; and forming a second protective film containing carbon on the first protective film.

According to the present invention, fluctuations in device operational characteristics can be reduced even if a SiN film is used as a protective film.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

Figure 1:
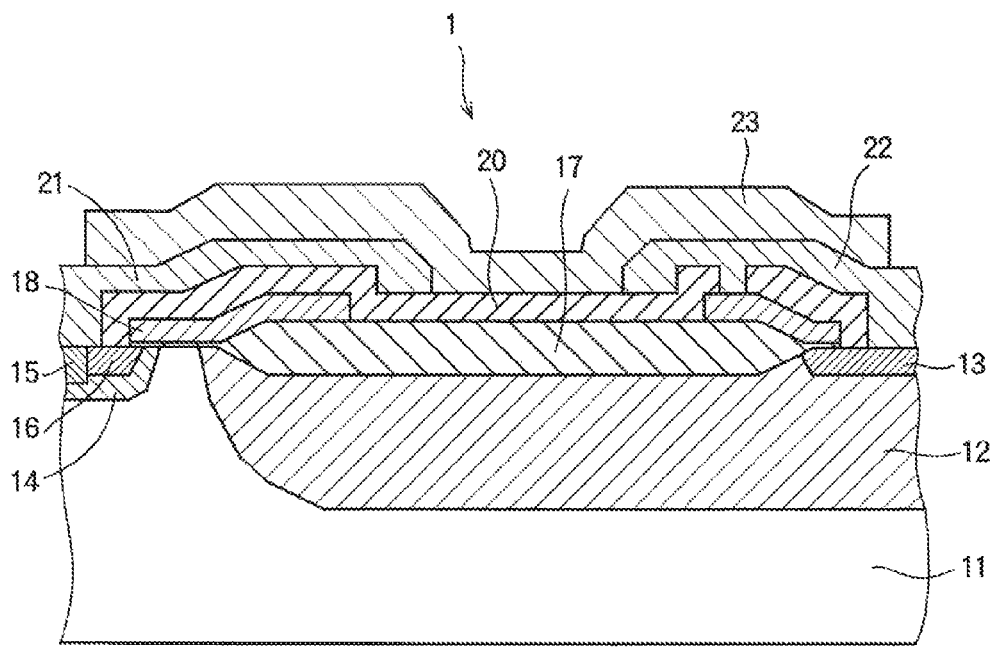
FIG. 1 is a longitudinal sectional view schematically illustrating a structure of a conventional semiconductor device.
Figure 2:
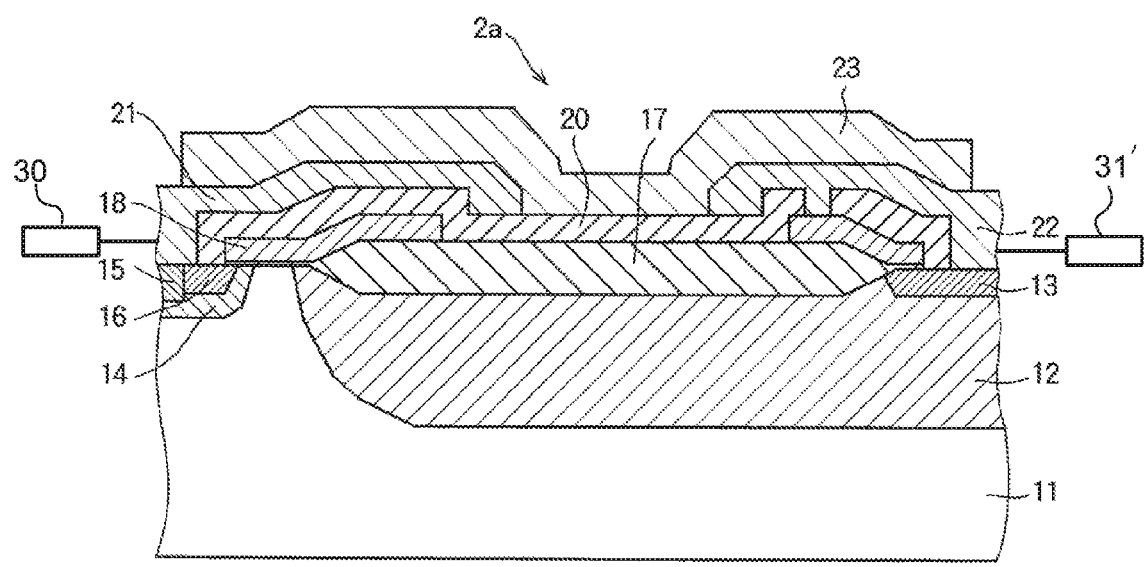
FIG. 2 is a longitudinal sectional view schematically illustrating a structure of a semiconductor device according to an embodiment of the present invention, before a final protective film is formed.
Figure 3:
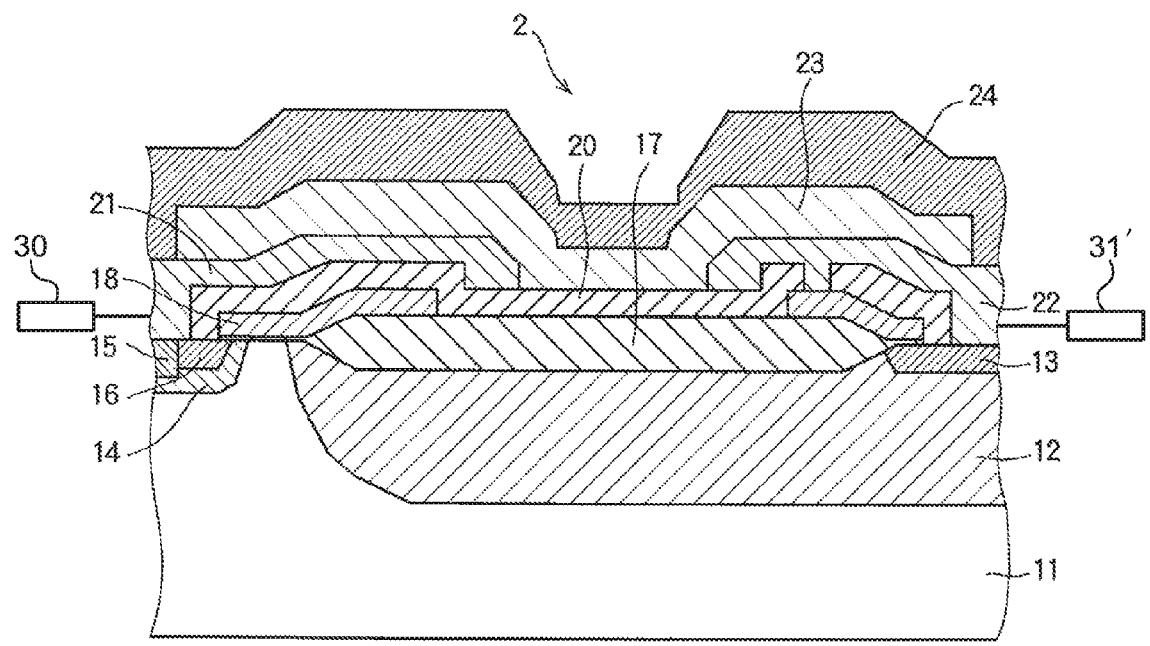
FIG. 3 is a longitudinal sectional view schematically illustrating a structure of the semiconductor device according to the embodiment, after the final protective film is formed.

FIG. 2 is a longitudinal sectional view schematically illustrating a structure 2a of a semiconductor device according to the embodiment of the present invention, before a final protective film is formed; and FIG. 3 is a longitudinal sectional view schematically illustrating a structure of semiconductor device 2 according to the embodiment, after the final protective film is formed. Constitutional elements in FIG. 2 and FIG. 3 that are the same as or correspond to those in FIG. 1 are assigned the same characters. As illustrated in FIG. 2 and FIG. 3, the semiconductor device 2 according to the embodiment includes a phospho-silicate glass (PSG) film 24 as a final protective film on a silicon nitride (SiN) film 23, and is different from the conventional semiconductor device 1 shown in FIG. 1 in this respect.

As illustrated in FIG. 2 and FIG. 3, the semiconductor device 2 is a lateral power MOSFET which has a RESURF structure. However, the present invention may be applied to a semiconductor device other than a lateral MOSFET, as long as the semiconductor device has a SiN film as a protective film.

As illustrated in FIG. 2 and FIG. 3, the semiconductor device 2 according to the embodiment includes a P-type semiconductor substrate (e.g., P-type Si substrate) 11, in which an N$^+$ drain region 13, a drain drift region (N-well region) 12, a P$^+$ impurity region 15, a P-type body region 14 and an N$^+$ source region 16 are formed. The semiconductor device 2 further includes a field oxide film (SiO$_2$ film) 17 on the drain drift region 12, a gate electrode 18 made of polysilicon or the like, an interlayer dielectric film (ILD) 20, a metal layer (source electrode) 21 connected to the P$^+$ impurity region 15, a metal layer (drain electrode) 22 connected to the N$^+$ drain region 13, and a SiN film (first protective film) 23 which is a protective film covering the whole of the power MOSFET. The film 23 may be a protective film containing SiN as a principal component, e.g., a multi-layered film having a SiN film and another film.

As the P-type semiconductor substrate 11, a substrate which has a volume resistivity of 80 to 180 Ωcm may be used, for example. However, the volume resistivity of the P-type semiconductor substrate 11 is not limited to the range of 80 to 180 Ωcm. The drain drift region (N-well region) 12 is a high-resistive impurity diffusion layer which is formed under the field oxide film 17. The drain drift region 12 has a width of several tens of μm and a surface resistivity of several hundred Ω/sq to several kΩ/sq (more desirably, a surface resistivity of about 0.5 to 1.5 kΩ/sq), for example. The SiN film 23 is a plasma nitride film i.e., a plasma-enhanced CVD silicon nitride (PE-SiN) film which is formed by a plasma-CVD process, for example.

In FIG. 3, the semiconductor device 2 further includes a final protective film (second protective film) 24 containing carbon, which is disposed on the SiN film 23. The final protective film 24 is a phospho-silicate glass (PSG) film, for example. The PSG film 24 is an O3-TEOS-PSG film which is formed by an atmospheric pressure CVD process using a Tetraethylorthosilicate (O3-TEOS) based material, for example. However, the final protective film 24 may be a film other than the PSG film, such as a boron phospho-silicate Glass (BPSG) film, an undoped silicon glass (USG) film or the like. A protective film containing phosphorus, such as the PSG film, has an advantage that a gettering effect can be obtained.

Because the semiconductor device has the second protective film 24 made of a PSG film, a BPSG film, a USG film or the like, external force from a package covering the whole device does not directly reach the SiN film 23 made of a hard and brittle material, but reaches the SiN film 23 through the second protective film 24 which has less hardness than the SiN film 23 (i.e., the weakened external force reaches the SiN film 23). Thus, the semiconductor device has a structure in which partially high stress is difficult to occur in the SiN film 23, and therefore damage to the SiN film 23 can be prevented. It is desirable that the second protective film 24 be a PSG film, because phosphorus contained in the PSG film reduces hardness of the second protective film 24 (i.e., it causes the second protective film 24 to have plasticity).

The semiconductor device according to the embodiment includes a pad 30 connected to the metal layer 21 and another pad 31' connected to the metal layer 22. When the semiconductor device is actually used, a voltage is applied between these pads.

Next, a method of manufacturing the semiconductor device 2 according to the embodiment will be described. A process of manufacturing the structure illustrated in FIG. 2 may be substantially the same as that of manufacturing the conventional semiconductor device 1 illustrated in FIG. 1.

The N-well region (impurity diffusion layer) 12 is firstly formed by diffusing impurities into the P-type semiconductor substrate 11 which is a Si substrate, and then the field oxide film 17 which is a LOCOS (local oxidation of silicon) for element isolation is formed by means of thermal oxidation or another technique. Next, a polysilicon film is formed, the polysilicon film is patterned, and thereby the gate electrode 18 is formed.

Next, source/drain (S/D) diffusion layers (e.g., regions represented by reference numerals 13 to 16 in FIG. 2) are formed by introducing conductive impurities into the semiconductor substrate 11, using the gate electrode 18 and the LOCOS as masks.

Next, the interlayer dielectric film (ILD) 20 is formed to cover the gate electrode 18 and the field oxide film 17, and the metal layers 21 and 22 are formed thereon. Then, a sintering process is performed in an H$_2$ atmosphere, and the PE-SiN film 23 as a protective film is formed.

After the PE-SiN film 23 is formed, the O3-TEOS (Tetraethylorthosilicate) based PSG film (also referred to as "O3-TEOS-PSG film") 24 is formed by an atmospheric pressure CVD process so as to be stacked on the PE-SiN film 23. The O3-TEOS-PSG film 24 is generated under the following conditions, for example:
(1) TEOS (whose chemical formula is Si(OC$_2$H$_5$)$_4$) flow amount: 2600 to 3400 sccm (Standard Cubic Centimeters per Minute)
(2) O$_3$ flow amount: 50 to 130 sccm
(3) TMOP (Trimethyl phosphate) (whose chemical formula is PO(OCH$_3$)$_3$) flow amount: 500 to 800 sccm
(4) generation temperature: 365 to 425° C.
A condition other than the above-mentioned conditions may be also used.

Figure 4:
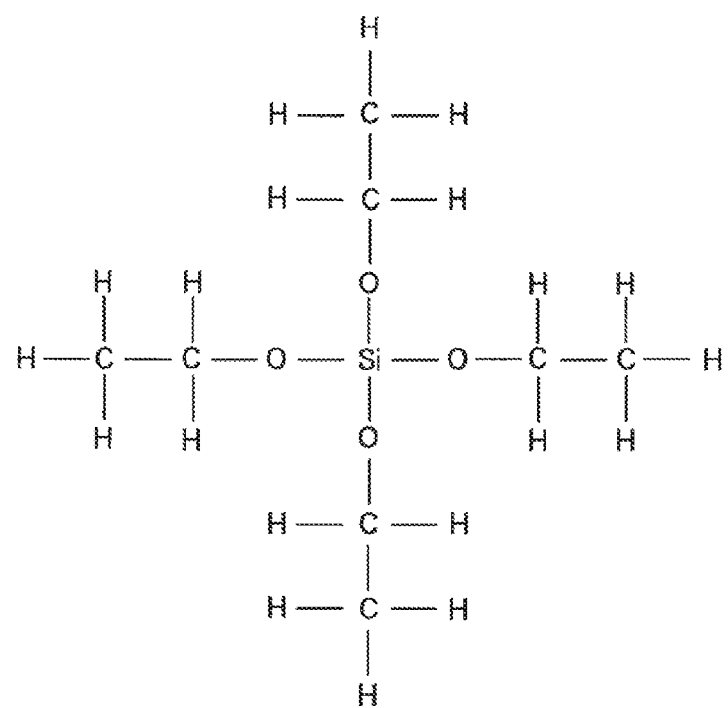
FIG. 4 is a diagram illustrating a TEOS molecular structure.

In this case, TEOS includes a material which has a molecular structure illustrated in FIG. 4. As can be understood from this molecular structure, carbon remains in the PSG film 24 under some conditions for generating the O3-TEOS-based PSG film 24. It is known that the carbon in the PSG film 24 functions as positive charge in the PSG film 24 and amount of residual carbon changes depending on the conditions for generating the O3-TEOS-PSG film 24. For example, if the O3-TEOS-PSG film 24 is generated on condition that the O$_3$ flow amount is reduced, it is confirmed that the amount of residual carbon in the generated O3-TEOS-PSG film 24 increases.

Figure 5:
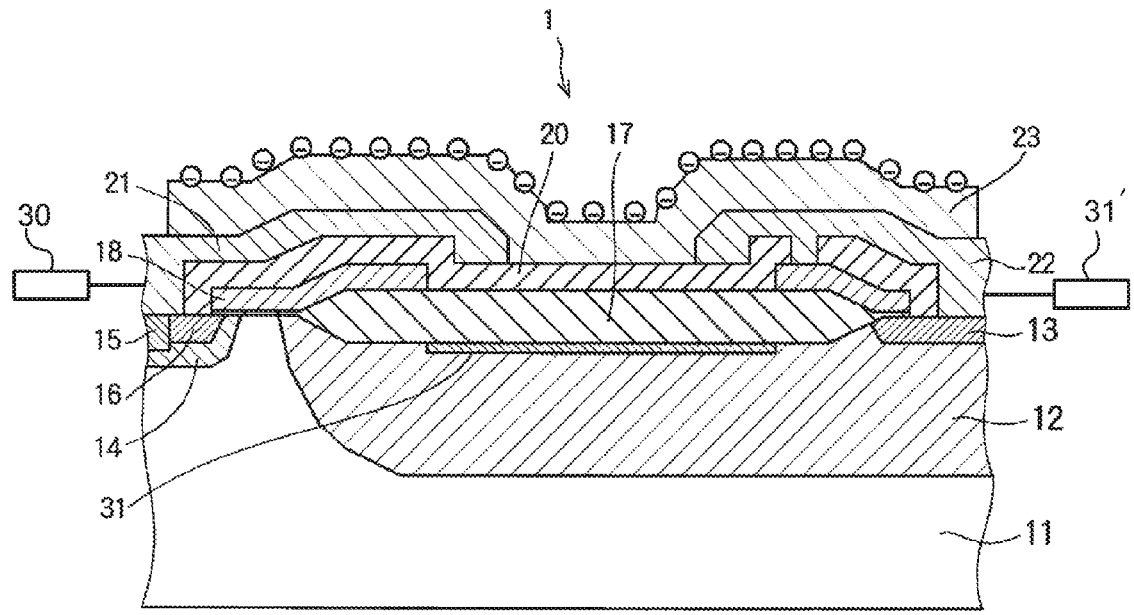
FIG. 5 is a diagram illustrating how a depletion layer is formed when a semiconductor device of a comparison example is actually used.
Figure 6:
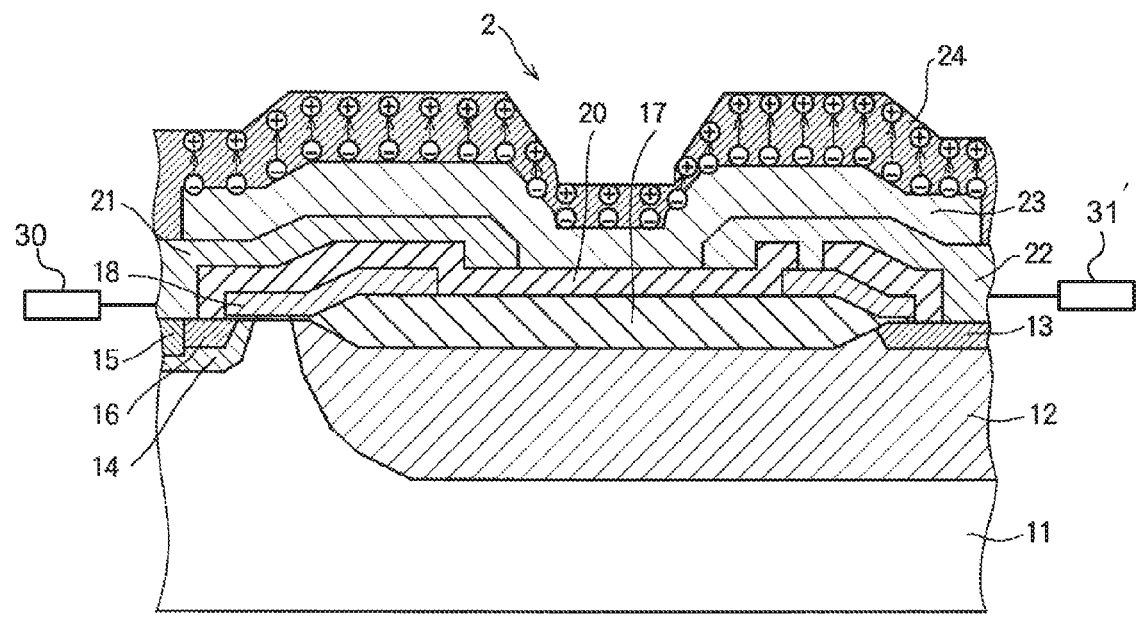
FIG. 6 is a diagram illustrating how no depletion layer is formed when the semiconductor device according to the embodiment is actually used.

FIG. 5 illustrates a comparison example where when the semiconductor device 2 is actually used and high voltage is applied between the pad 30 connected to the metal layer (source electrode) 21 and the other pad 31' connected to the metal layer (drain electrode) 22, a surface leakage current flows through an outer layer of the PE-SiN film 23 and therefore electrons (conceptually represented by encircled minus signs in the drawing) are trapped in a surface of the PE-SiN film 23. At the time, a depletion layer 31 may be formed under the field oxide film 17 because of the negative charges in the surface of the PE-SiN film 23, and operational characteristics of the semiconductor device 2 fluctuate in this case. When the high voltage is applied between the pads, a large number of electrons are trapped and therefore the characteristics greatly fluctuate. Thus, the present invention is remarkably effective in the semiconductor device 2 to which the high voltage is applied, especially, in a lateral power MOSFET.

In the embodiment where the PSG film 24 containing the residual carbon is disposed on the PE-SiN film 23, the negative charges resulting from the trapped electrons in the surface of the PE-SiN film 23 are canceled out by the positive charges resulting from the residual carbon in the PSG film 24 (conceptually represented by encircled plus signs in the drawing) and therefore no depletion layer 31 occurs under the field oxide film 17. Thus, a temporal change in transistor characteristics can be controlled in the semiconductor device 2 of the present embodiment which is the lateral power MOSFET.

As described above, in the present embodiment, the O3-TEOS-PSG film 24 as the second protective film is generated so as to be stacked on the PE-SiN film 23 which is the first protective film, and the O3-TEOS-PSG film 24 is generated on condition that the amount of residual carbon in the PSG film 24 increases by reducing the $O_3$ flow amount. Thus, the negative charge resulting from the trapped electrons in the surface of the PE-SiN film 23 can be canceled out by the positive charge resulting from the carbon in the PSG film 24. Therefore, a temporal change in transistor characteristics of the lateral power MOSFET can be controlled and transistor reliability of the lateral power MOSFET can be improved.

Although it is explained in the present embodiment that the $O_3$ flow amount is reduced in order to increase the amount of residual carbon in the PSG film 24, the amount of residual carbon in the PSG film 24 may be controlled by increasing the TEOS flow amount or reducing the generation temperature. A combination of any of the reduction in $O_3$ flow amount, the increase in TEOS flow amount and the reduction in generation temperature may be used for controlling the residual carbon in the PSG film 24.

In the above explanation, a description has been made as to a case where a single lateral power MOSFET is disposed on the semiconductor substrate. However, the present invention may be applied to a case where a plurality of lateral power MOSFETs is disposed on the semiconductor substrate 11.

Figure 7:
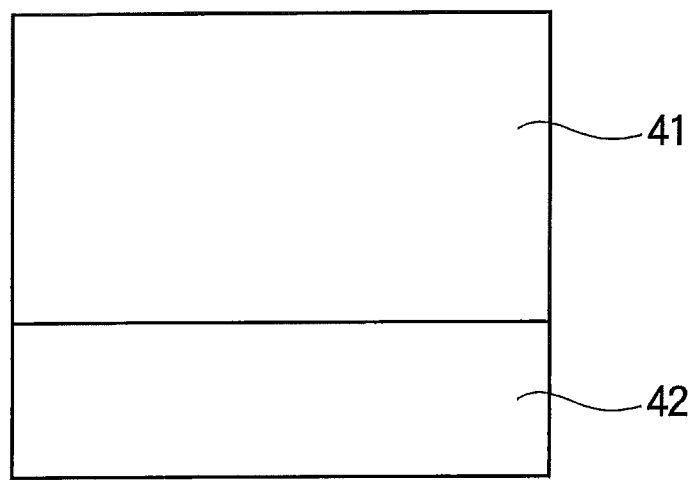
FIG. 7 is a plan view illustrating an example that a semiconductor device includes a lateral power MOSFET and another device.

As illustrated in a schematic plan view of FIG. 7, the present invention may be applied to a semiconductor device having a semiconductor substrate on which two regions 41 and 42 are disposed: the region (first region) 41 where a plurality of lateral power MOSFETs are formed; and the other region (second region) 42 which is disposed side by side with the region 41 and includes a drive control circuit for driving the lateral power MOSFETs. In the region 42 which is a region other than the region 41 where the lateral power MOSFETs are formed, a semiconductor element other than the drive control circuit for the lateral power MOSFETs may be formed, e.g., a general MOSFET, a bipolar transistor or the like. For example, a drain region, a source region and an impurity diffusion region of the power MOSFET may be included in the first region 41, and the drive control circuit for applying voltage to the drain region and the source region may be included in the second region 42. The present invention may be applied to a semiconductor device which includes a SiN film as a protective film, and it can be remarkably effective in a semiconductor device to which a high-voltage signal is applied as a control signal.

Although the numerical values or the range of numerical values as desirable examples have been described in the above explanation, other numerical values or range of numerical values are also available.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A semiconductor device comprising:
    a semiconductor substrate including a drain part and a source part, the drain part and the source part being formed by doping an impurity into the semiconductor substrate;
    a first dielectric layer formed in an area between the source part and the drain part, the first dielectric layer including a first portion and a second portion whose thickness is smaller than a thickness of the first portion;
    a gate electrode formed on the area and disposed on the semiconductor substrate and the first and second portions of the first dielectric layer;
    a second dielectric layer formed to cover the gate electrode and a surface of the semiconductor substrate;
    a metal layer formed on the second dielectric layer;
    a first pad being electrically connected to the source part;
    a second pad being electrically connected to the drain part;
    a first protective film including silicon nitride as a principal component and being formed on the second dielectric layer and formed to directly cover the metal layer; and
    a second protective film containing carbon and being formed to directly cover the first protective film,
    wherein the second protective film is formed by a CVD process using O3-TEOS.

2. The semiconductor device according to claim 1, wherein:
    the first dielectric layer is formed between at least a part of the gate electrode and the semiconductor substrate;
    the first portion and the second portion are arranged in a direction from the source part toward the drain part in this order; and
    the thickness of the first portion is greater than the thickness of the second portion in a direction perpendicular to the semiconductor substrate.

3. The semiconductor device according to claim 1, further comprising a first impurity diffusion layer, wherein the drain part is covered by the first impurity diffusion layer which has a lower impurity concentration than the drain part in the semiconductor substrate, the first impurity diffusion layer being formed so as to extend below the gate electrode.

4. The semiconductor device according to claim 3, further comprising:
    a first region and a second region in the semiconductor substrate, the second region being adjacent to the first region;
    wherein the drain part, the source part and the impurity diffusion layer are formed in the first region; and
    a drive control circuit for applying voltage to the drain part and the source part is formed in the second region.

5. The semiconductor device according to claim 1, wherein the first protective film traps electrons on a surface of the first protective film, when voltage is applied between the first pad and the second pad, and a current flows on the surface of the first protective film.

6. A semiconductor device comprising:
    a semiconductor substrate including a drain part and a source part, the drain part and the source part being formed by doping an impurity into the semiconductor substrate;
    a first dielectric layer formed in an area between the source part and the drain part, the first dielectric layer including a first portion and a second portion whose thickness is smaller than a thickness of the first portion;
a gate electrode formed on the area and disposed on the semiconductor substrate and the first and second portions of the first dielectric layer;
a second dielectric layer formed to cover the gate electrode and a surface of the semiconductor substrate;
a metal layer formed on the second dielectric layer;
a first pad being electrically connected to the source part;
a second pad being electrically connected to the drain part;
a first protective film including silicon nitride as a principal component and being formed on the second dielectric layer and formed to directly cover the metal layer; and
a second protective film containing carbon and being formed to directly cover the first protective film,
wherein the second protective film is any of a phospho-silicate glass (PSG) film containing carbon, a boron phospho-silicate Glass (BPSG) film containing carbon, and an undoped silicon glass (USG) film containing carbon.

7. The semiconductor device according to claim 6, wherein
the first dielectric layer is formed between at least a part of the gate electrode and the semiconductor substrate,
the first portion and the second portion are arranged in a direction from the source part toward the drain part in this order, and
the thickness of the first portion is greater than the thickness of the second portion in a direction perpendicular to the semiconductor substrate.

8. The semiconductor device according to claim 6, further comprising a first impurity diffusion layer, wherein the drain part is covered by the first impurity diffusion layer which has a lower impurity concentration than the drain part in the semiconductor substrate, the first impurity diffusion layer being formed so as to extend below the gate electrode.

9. The semiconductor device according to claim 6, wherein the first protective film traps electrons on a surface of the first protective film, when voltage is applied between the first pad and the second pad, and a current flows on the surface of the first protective film.

* * * * *